(12) United States Patent
Furukawa et al.

(10) Patent No.: US 12,317,713 B2
(45) Date of Patent: May 27, 2025

(54) DISPLAY DEVICE

(71) Applicant: SHARP KABUSHIKI KAISHA, Sakai (JP)

(72) Inventors: Hiroyuki Furukawa, Sakai (JP); Masafumi Ueno, Sakai (JP); Chie Toridono, Sakai (JP); Yoshihiro Ueta, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 518 days.

(21) Appl. No.: 17/781,335

(22) PCT Filed: Dec. 12, 2019

(86) PCT No.: PCT/JP2019/048695
§ 371 (c)(1),
(2) Date: May 31, 2022

(87) PCT Pub. No.: WO2021/117187
PCT Pub. Date: Jun. 17, 2021

(65) Prior Publication Data
US 2023/0006000 A1 Jan. 5, 2023

(51) Int. Cl.
*H10K 59/35* (2023.01)
*G09G 3/3291* (2016.01)
(Continued)

(52) U.S. Cl.
CPC ........... *H10K 59/35* (2023.02); *G09G 3/3291* (2013.01); *G09G 3/3607* (2013.01);
(Continued)

(58) Field of Classification Search
CPC .............. G09G 3/3291; G09G 3/3607; G09G 2320/0233; G09G 2340/06; G09G 3/2003;
(Continued)

(56) References Cited

U.S. PATENT DOCUMENTS

| 10,580,384 | B1* | 3/2020 | Woodall | ............... G09G 5/02 |
| 2005/0275668 | A1* | 12/2005 | Feng | ............... G09G 3/3611 |
| | | | | 345/694 |

(Continued)

FOREIGN PATENT DOCUMENTS

| JP | 2006-506664 A | 2/2006 |
| JP | 2017-003949 A | 1/2017 |

(Continued)

*Primary Examiner* — Hong Zhou
(74) *Attorney, Agent, or Firm* — ScienBiziP, P.C.

(57) ABSTRACT

A display device includes: a first subpixel including a quantum dot light-emitting layer configured to emit light of a first color: a second subpixel including a quantum dot light-emitting layer configured to emit light of a second color different from the light of the first color: a third subpixel including a quantum dot light-emitting layer configured to emit light of a third color different from the light of the first color and the light of the second color: and a data processing circuit configured to receive a first input data corresponding to the first subpixel, a second input data corresponding to the second subpixel, and a third input data corresponding to the third subpixel. The data processing circuit generates first output data corresponding to a first data voltage supplied to the first subpixel by using the first input data, the second input data, and the third input data.

20 Claims, 9 Drawing Sheets

(51) Int. Cl.
  *G09G 3/36* (2006.01)
  *H10K 50/115* (2023.01)
(52) U.S. Cl.
  CPC ... *H10K 50/115* (2023.02); *G09G 2320/0233* (2013.01); *G09G 2340/06* (2013.01)
(58) Field of Classification Search
  CPC ......... G09G 3/2011; G09G 2320/0276; G09G 2320/041; G09G 5/06; G09G 2320/0242; G09G 2320/0673; H10K 59/35; H10K 50/115; H05B 33/14
  See application file for complete search history.

(56) References Cited

U.S. PATENT DOCUMENTS

| | | | |
|---|---|---|---|
| 2006/0208983 | A1 | 9/2006 | Lee et al. |
| 2014/0002481 | A1* | 1/2014 | Broughton ............... G09G 5/02 345/591 |
| 2015/0154937 | A1* | 6/2015 | Funatsu ................ G06T 11/001 345/83 |
| 2017/0249888 | A1* | 8/2017 | Tanaka ................. G09G 3/3648 |
| 2018/0286349 | A1* | 10/2018 | Mohammadi ............ G09G 3/20 |
| 2018/0330681 | A1 | 11/2018 | Kurokawa |
| 2019/0172874 | A1* | 6/2019 | Lim ...................... H10K 59/879 |
| 2019/0185743 | A1 | 6/2019 | Kim et al. |
| 2019/0320517 | A1 | 10/2019 | Nakanishi et al. |
| 2021/0125545 | A1* | 4/2021 | Sohn ........................ G09G 3/32 |
| 2021/0324263 | A1 | 10/2021 | Kim et al. |

FOREIGN PATENT DOCUMENTS

| | | |
|---|---|---|
| JP | 2018-194592 A | 12/2018 |
| JP | 2019-109515 A | 7/2019 |
| WO | 2019/064541 A1 | 4/2019 |

* cited by examiner

DISPLAY DEVICE

TECHNICAL FIELD

The disclosure relates to a display device.

BACKGROUND ART

PTL 1 discloses a technique for using quantum dots, which absorb excitation light and emit light having a longer wavelength than the excitation light, in a color filter.

CITATION LIST

Patent Literature

PTL 1: JP 2019-109515 A

SUMMARY OF INVENTION

Technical Problem

In a case where a quantum dot light-emitting layer is provided in a subpixel of a display device, a phenomenon has been observed in which some of the light emitted from the quantum dot light-emitting layer is self-absorbed by the quantum dot light-emitting layer and then re-emitted. Since this phenomenon involves absorption on a short wavelength side and re-emission on a long wavelength side, the light emission wavelength characteristic shifts closer to the long wavelength side especially in high gray scale display, which causes color shift.

SUMMARY

A display device according to an aspect of the disclosure includes a first subpixel including a quantum dot light-emitting layer for emitting light of a first color, a second subpixel including a quantum dot light-emitting layer for emitting light of a second color different from the light of the first color, a third subpixel including a quantum dot light-emitting layer for emitting light of a third color different from the light of the first color and the light of the second color, and a data processing circuit for receiving a first input data corresponding to the first subpixel, a second input data corresponding to the second subpixel, and a third input data corresponding to the third subpixel,
  wherein the data processing circuit generates first output data corresponding to a first data voltage supplied to the first subpixel by using the first input data, the second input data, and the third input data.

Advantageous Effects of Disclosure

According to an aspect of the disclosure, it is possible to suppress color shift of a display device including a quantum dot light-emitting layer in each subpixel.

DESCRIPTION OF EMBODIMENTS

First Embodiment

Figure 1:
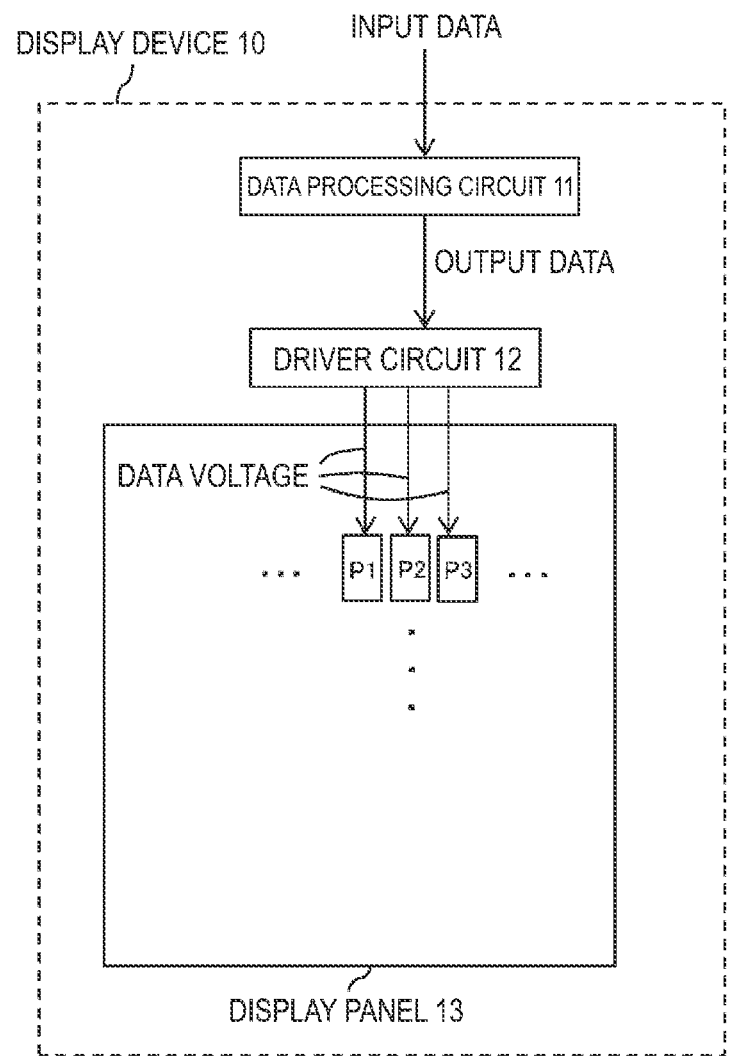
FIG. 1 is a block diagram illustrating a configuration of a display device according to a first embodiment.

FIG. 1 is a block diagram illustrating a configuration of a display device of a first embodiment, FIG. 2(a) is a schematic plan view illustrating a configuration of subpixels of the first embodiment, and FIG. 2(b) is a cross-sectional view illustrating a configuration of the subpixels. As illustrated in FIG. 1, the display device 10 includes a data processing circuit 11 and a display panel 13. The display panel 13 is provided with a plurality of subpixels including a first subpixel P1, a second subpixel P2, and a third subpixel P3, and a driver circuit 12 that drives these subpixels.

The data processing circuit 11 receives input data and generates output data. The driver circuit 12 receives output data from the data processing circuit 11 and generates data voltages to be supplied to a plurality of subpixels including subpixels P1 to P3.

Figure 2:
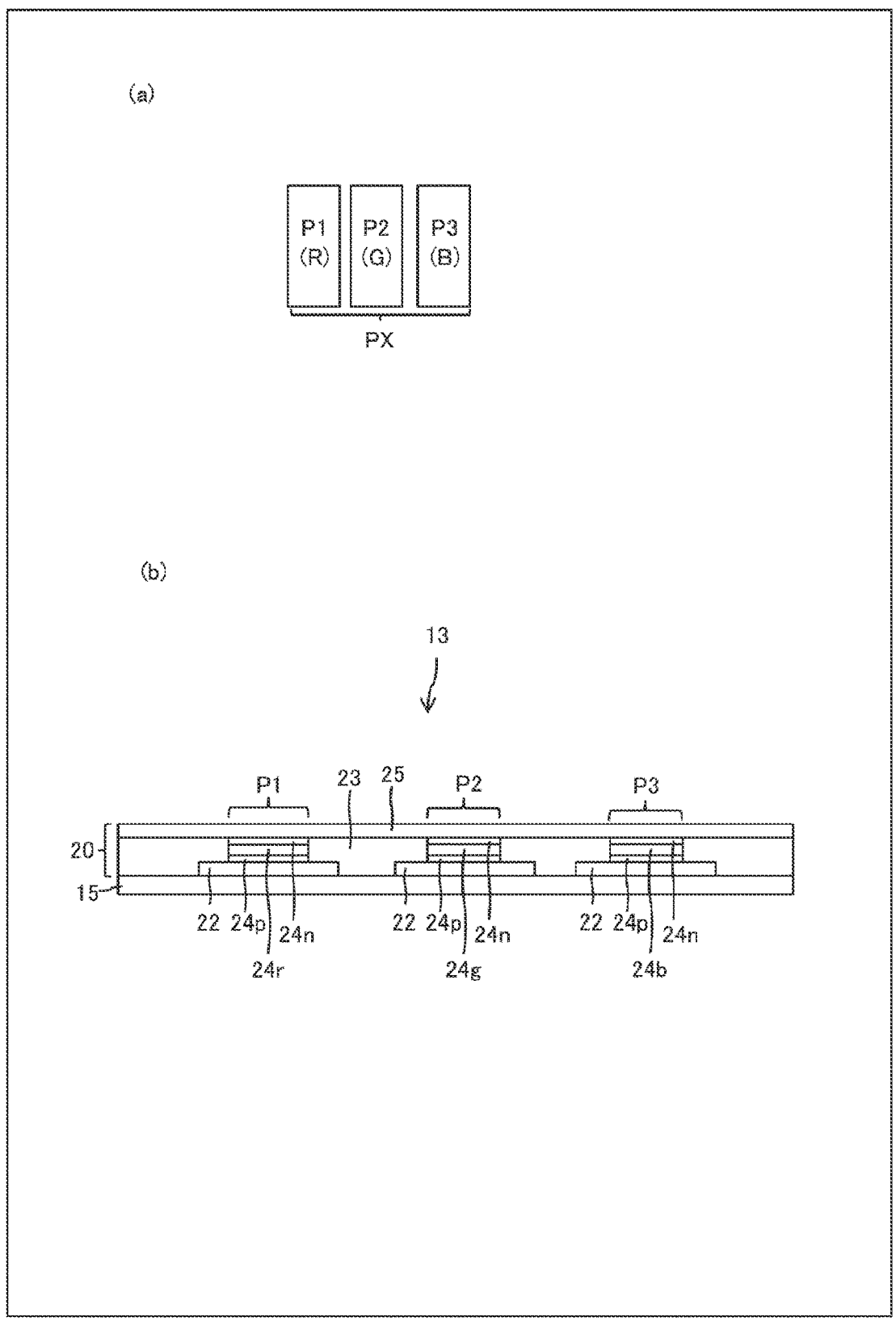
FIG. 2(a) is a schematic plan view illustrating a configuration of subpixels of the first embodiment.
FIG. 2(b) is a cross-sectional view illustrating the configuration of the subpixels.

As illustrated in FIG. 2, the display panel 13 includes a thin film transistor layer 15 and a light-emitting element layer 20, and the light-emitting element layer 20 is provided with lower layer electrodes 22 (anodes), edge cover films 23 covering edges of the lower layer electrodes 22, positive hole transport layers 24p, quantum dot light-emitting layers 24r, 24g, and 24b each including quantum dots, electron transport layers 24n, and a common electrode 25 (cathode), in order from a lower layer side. The lower layer electrodes 22 are formed by, for example, layering indium tin oxide (ITO) and Ag (silver) or an alloy including Ag, and have light reflectivity. The common electrode 25 is formed of a metal thin film of a magnesium silver alloy or the like, and has optical transparency.

The first subpixel P1, the second subpixel P2, and the third subpixel P3 constitute a pixel PX, and the second subpixel P2 is adjacent to the first subpixel P1 and the third subpixel P3. Note that the first subpixel P1 and the second subpixel P2 may be configured to belong to the same pixel, and the third subpixel P3 may be configured to belong to another pixel.

The first subpixel P1 includes a quantum dot light-emitting layer 24r that emits light of a first color, the second subpixel P2 includes a quantum dot light-emitting layer 24g that emits light of a second color, and the third subpixel P3 includes a quantum dot light-emitting layer 24b that emits light of a third color. In the first embodiment, the light of the first color is red light, the light of the second color is green light, and the light of the third color is blue light.

Positive holes and electrons recombine inside the quantum dot light-emitting layers 24r, 24g, and 24b due to a drive current between the lower layer electrodes 22 and the common electrode 25, and light is emitted when the excitons generated in this manner transition from the conduction band of the quantum dot to the valence band.

Figure 3:
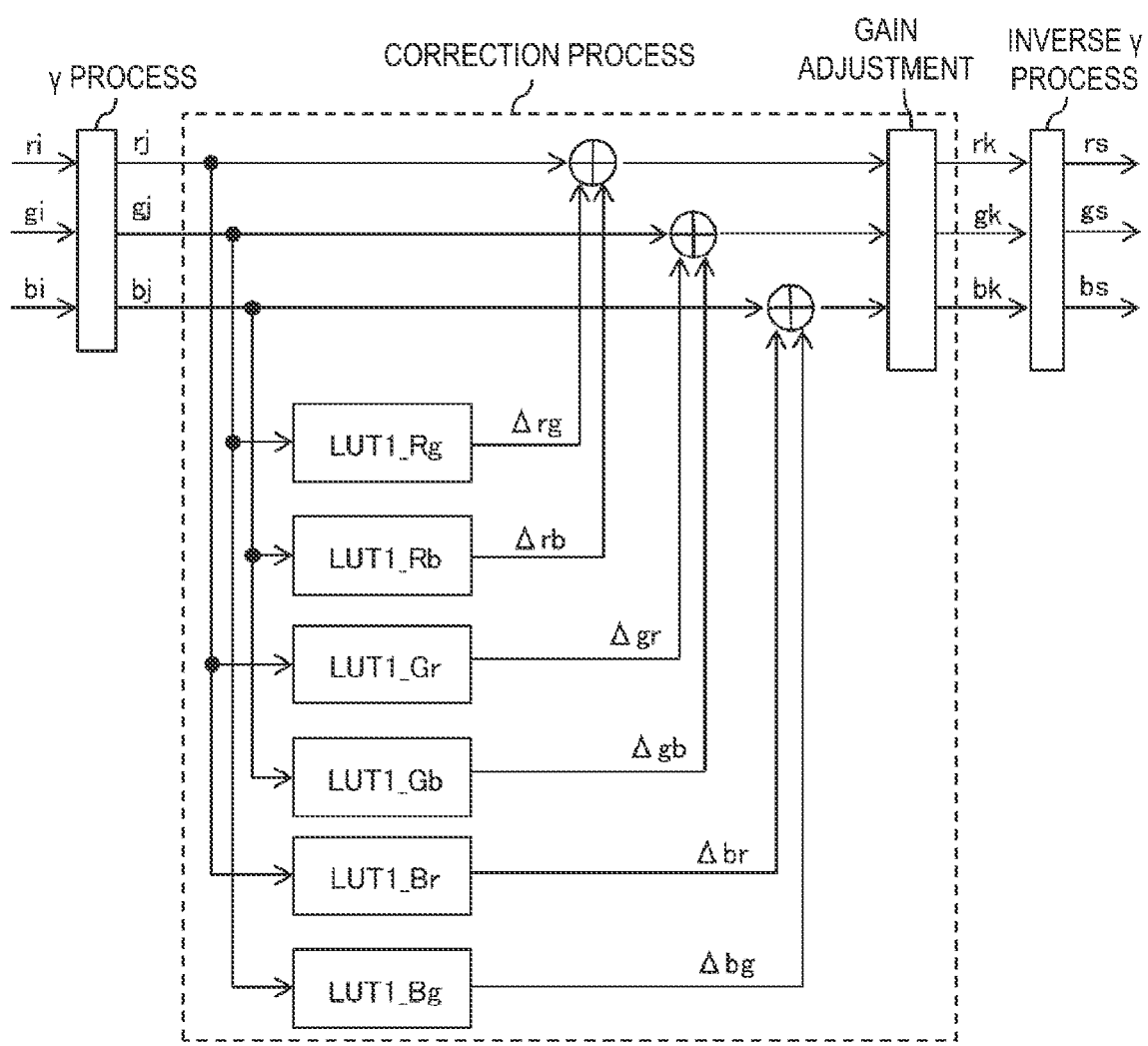
FIG. 3 is a block diagram illustrating a processing step of a data processing circuit of the first embodiment.

FIG. 3 is a block diagram illustrating a processing step of a data processing circuit of the first embodiment. The data processing circuit 11 sequentially performs a process, a correction process, and an inverse γ process on first input data ri corresponding to the first subpixel P1, second input data gi corresponding to the second subpixel P2, and third input data bi corresponding to the third subpixel P3, thus generating first output data rs corresponding to a first data voltage supplied to the first subpixel P1, second output data gs corresponding to a second data voltage supplied to the second subpixel P2, and third output data bs corresponding to a third data voltage supplied to the third subpixel P3. Here, the first input data ri corresponding to the first subpixel P1 is, for example, data of a gray scale value displayed in the first subpixel P1. The same applies to the second input data gi and the third input data bi.

In the γ process, data rj (first conversion data), data gj (second conversion data), and data bj (third conversion data), which are optically linear data, are generated from the first input data ri, the second input data gi, and the third input data bi, respectively. Specifically, a power with γ=2.2 as an exponent is calculated for each of a gray scale indicated by the first input data ri, a gray scale indicated by the second input data gi, and a gray scale indicated by the third input data bi.

In the correction process, corrected data rk, gk, and bk are generated from the data rj, gj, and bj. Specifically, first, a correction value Δrg of the data rj based on the data gj is determined using a look-up table LUT1_Rg, a correction value Δrb of the data rj based on the data bj is determined using a look-up table LUT1_Rb, a correction value Δgr of the data gj based on the data rj is determined using a look-up table LUT1_Gr, a correction value Δgb of the data gj based on the data bj is determined using a look-up table LUT1_Gb, a correction value Δbr of the data bj based on the data rj is determined using a look-up table LUT1_Br, and a correction value Δbg of the data bj based on the data gj is determined using a look-up table LUT1_Bg.

Next, data rk (first correction data) is generated by performing gain adjustment (brightness adjustment processing) on an addition result of a value indicated by the data rj, Δrg and Δrb, data gk (second correction data) is generated by performing gain adjustment (brightness adjustment processing) on an addition result of a value indicated by the data gj, Δgr and Δgb, and data bk (third correction data) is generated by performing gain adjustment (brightness adjustment processing) on an addition result of a value indicated by the data bj, Δbr, and Δbg. In the gain adjustment, a coefficient (for example, a coefficient of a value indicated by the data gj/a value indicated by the data gk) is multiplied.

In the reverse γ process, the first output data rs, the second output data gs, and the third output data bs indicating gray scales are generated from the data rk, gk, and bk, respectively. Specifically, for example, a power with reverse γ=−2.2 as an exponent is calculated for each of the value indicated by the data rk, the value indicated by the data gk, and a value indicated by the data bk.

Figure 4:
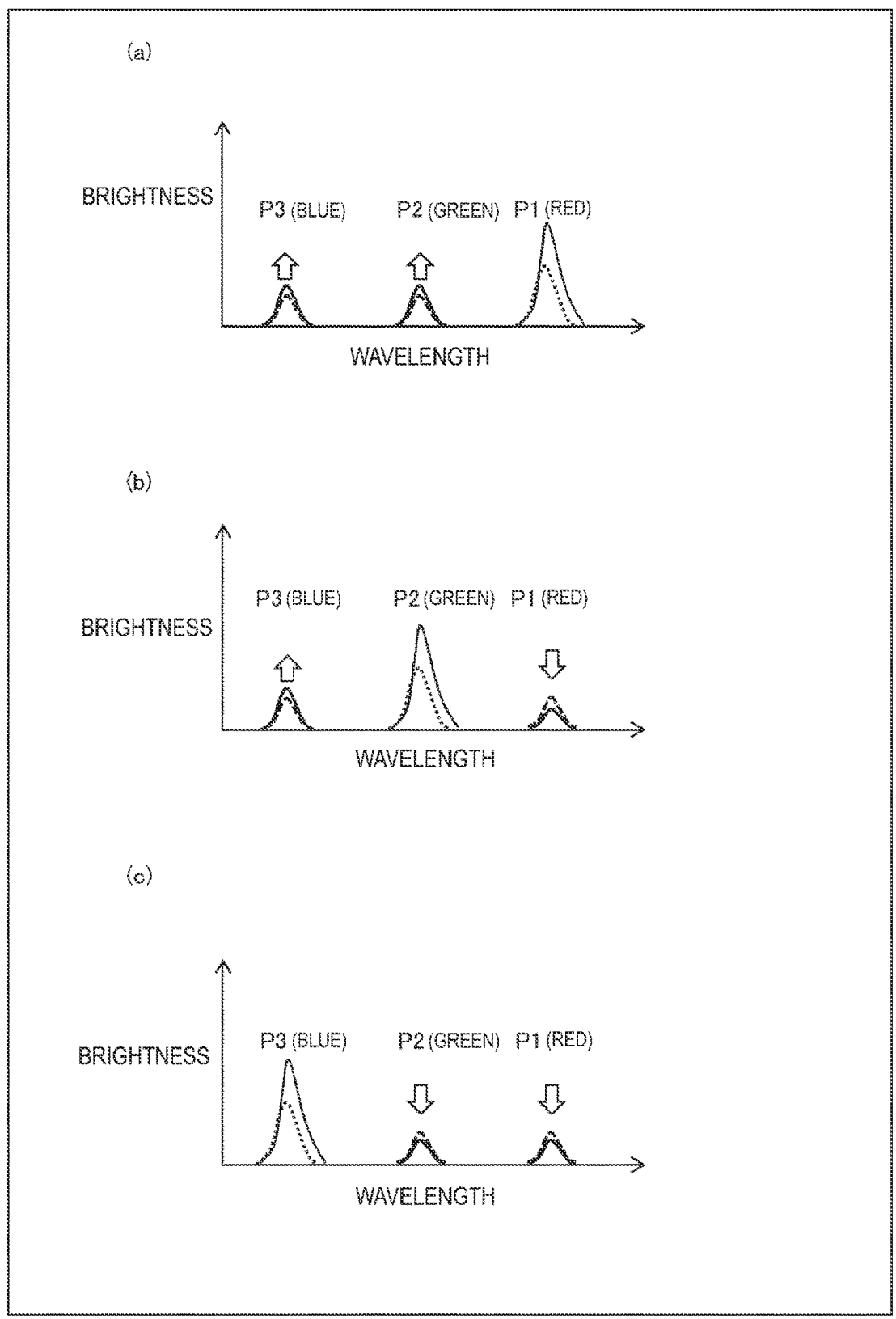
FIG. 4 is a graph describing an example of a correction process in FIG. 3.

FIG. 4 is a graph describing an example of a correction process in FIG. 3. As illustrated in FIGS. 4(a), 4(b), and 4(c), a wavelength range of the light (red light) of the first color is closer to the long wavelength side than a wavelength range of the light (green light) of the second color, and a wavelength range of the light of the second color is closer to the long wavelength side than a wavelength range of the light (blue light) of the third color.

For Δgr and Δbr in FIG. 3, Δgr≥0 and Δbr≥0, and the absolute values of Δgr and Δbr are larger in a case where a gray scale of the first input data ri is higher than the center of the full gray scale than in a case where the gray scale is lower. As shown in FIG. 4(a), in a case where a gray scale of the first subpixel P1 is high (high brightness), the light emission wavelength characteristic of the first subpixel P1 (red) is shifted closer to the long wavelength side, and thus correction for increasing the gray scale (increasing brightness) of the second subpixel P2 (green) and the third subpixel P3 (blue) is performed to suppress color shift of the first subpixel P1, the second subpixel P2, and the third subpixel P3 as a whole. The brightness shift as a whole due to a gray scale correction of the second subpixel P2 and the third subpixel P3 is corrected by the gain adjustment.

For example, in a case where the gray scale of the first input data ri is Tc, which is lower than the center of the full gray scale, a gray scale of the second input data gi is Tm, and a gray scale of the third input data bi is Tn, a gray scale of the second output data gs is TGc, and a gray scale of the third output data bs is TBc, and in a case where the gray scale of the first input data ri is Td, which is higher than the center of the full gray scale, the gray scale of the second input data gi is Tm, and the gray scale of the third input data bi is Tn, the scale of the second output data gs is TGd, and the gray scale of the third output data bs is TBd, TGc<TGd and TBc<TBd are satisfied.

For Δrg and Δbg in FIG. 3, Δrg≤0 and Δbg≥0, and the absolute values of Δrg and Δbg are larger in a case where the gray scale of the second input data gi is higher than the center of the full gray scale than in a case where the gray scale is lower. As shown in FIG. 4(b), in a case where the gray scale of the second subpixel P2 is high (high brightness), the light emission wavelength characteristic of the second subpixel P2 (green) is shifted closer to the long wavelength side, and thus correction for decreasing the gray scale (decreasing brightness) of the first subpixel P1 (red) and increasing the gray scale (increasing brightness) of the third subpixel P3 (blue) is performed to suppress the color shift of the first subpixel P1, the second subpixel P2, and the third subpixel P3 as a whole. Note that, the brightness shift as a whole due to the gray scale correction of the second subpixel P2 and the third subpixel P3 is corrected by the gain adjustment.

For example, in a case where the gray scale of the first input data ri is Tm, the gray scale of the second input data gi is Te, which is lower than the center of the full gray scale, and the gray scale of the third input data bi is Tn, the gray scale of the first output data rs is TRe, and the gray scale of the third output data bs is TBe, and in a case where the gray scale of the first input data ri is Tm, the gray scale of the second input data gi is Tf, which is higher than the center of the full gray scale, and in a case where the gray scale of the third input data bi is Tn, the gray scale of the first output data rs is TRf, and the gray scale of the third output data bs is the TBf, TRe>TRf and TBe<TBf are satisfied.

For Δrb and Δgb in FIG. 3, Δrb≤0 and Δgb≤0, and the absolute values of Δrb and Δgb are larger in a case where the gray scale of the third input data hi is higher than the center of the full gray scale than in a case where the gray scale is lower. As shown in FIG. 4(c), in a case where the gray scale of the third subpixel P3 is high (high brightness), the light emission wavelength characteristic of the third subpixel P3 (blue) is shifted closer to the long wavelength side, and thus correction for decreasing the gray scale (decreasing brightness) of the first subpixel P1 (red) and the second subpixel P2 (green) is performed to suppress the color shift of the first subpixel P1, the second subpixel P2, and the third subpixel P3 as a whole. Note that the brightness shift as a whole due to the gray scale correction of the first subpixel P1 and the second subpixel P2 is corrected by the gain adjustment.

For example, in a case where the gray scale of the first input data ri is Tm, the gray scale of the second input data gi is Tn, and the gray scale of the third input data bi is Tp, which is lower than the center of the full gray scale, the gray scale of the first output data rs is TRp and the gray scale of the second output data gs is TGp, and in a case where the gray scale of the first input data ri is Tm, the gray scale of the second input data gi is Tn, and the gray scale of the third input data bi is Tq, which is higher than the center of the full gray scale, the gray scale of the first output data rs is TRq and the gray scale of the second output data gs is TGq, TRp>TRq and TGp>TGq are satisfied.

As described above, according to the first embodiment, it is possible to suppress color shift of the display device 10 including the quantum dot light-emitting layer in each subpixel.

Second Embodiment

Figure 5:
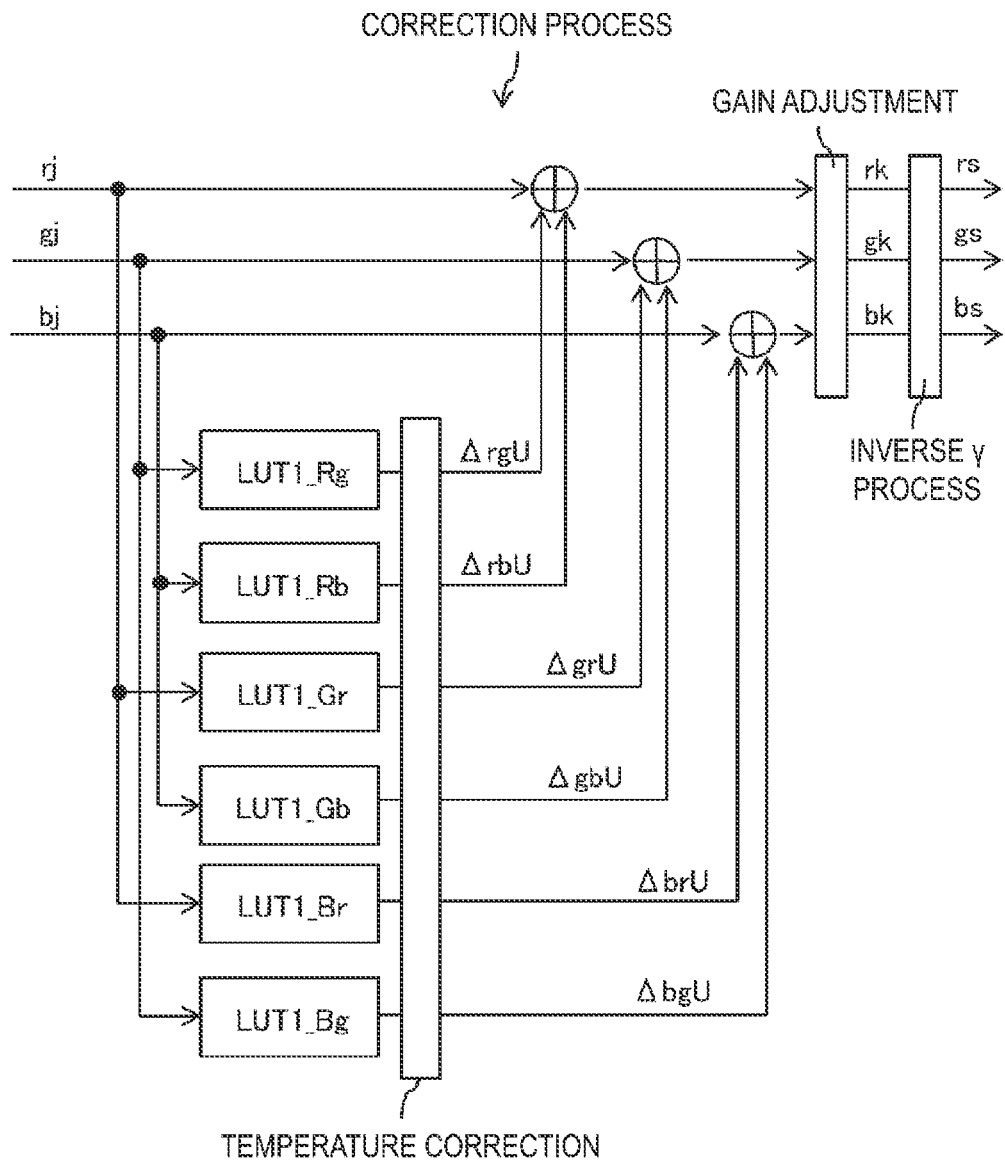
FIG. 5 is a block diagram illustrating a processing step of a data processing circuit of a second embodiment.

FIG. 5 is a block diagram illustrating a processing step of a data processing circuit of a second embodiment. In the second embodiment, a temperature sensor is provided in the display panel 13, and the data processing circuit 11 performs temperature correction.

Specifically, correction values ΔrgU, ΔrbU, ΔgrU, ΔgbU, ΔbrU, and ΔbgU are calculated by multiplying correction values Δrg, Δrb, Δgr, Δgb, Δbr, and Δbg, respectively, in FIG. 3 by a temperature coefficient based on the measurement result of the temperature sensor.

In this case, the data rk is generated by performing gain adjustment on an addition result of the value indicated by the data rj, ΔrgU and ΔrbU, the data gk is generated by performing gain adjustment on an addition result of the value indicated by the data gj, ΔgrU and ΔgbU, and the data bk is generated by performing gain adjustment on an addition result of the value indicated by the data bj, ΔbrU, and ΔbgU. Then, the reverse γ process is performed on the data rk, gk, and bk to generate the first output data rs, the second output data gs, and the third output data bs, respectively.

In the second embodiment, since the temperature correction is performed, the color shift can be more accurately suppressed.

Third Embodiment

Figure 6:
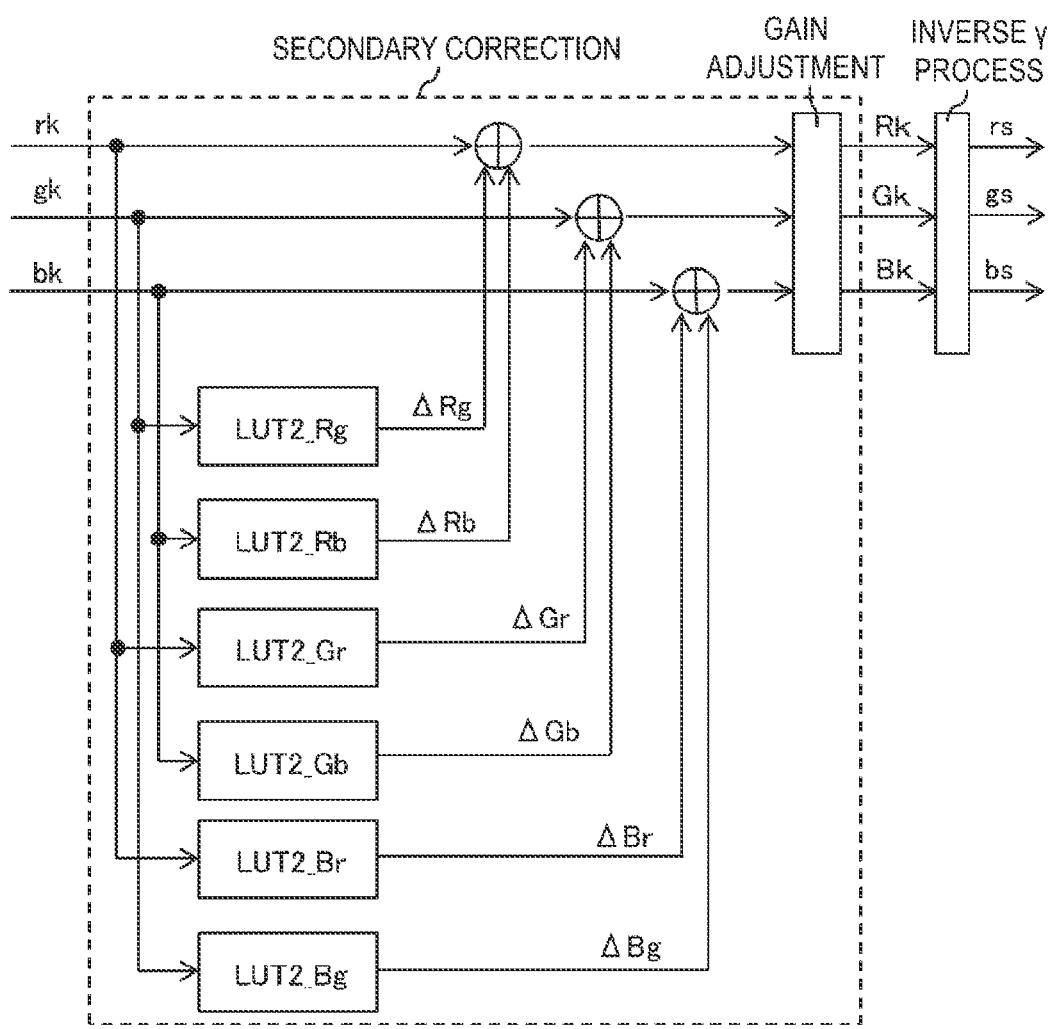
FIG. 6 is a block diagram illustrating a processing step of a data processing circuit of a third embodiment.

FIG. 6 is a block diagram illustrating a processing step of a data processing circuit of a third embodiment. In the third embodiment, the data processing circuit 11 generates the data rk (first correction data), the data gk (second correction data), and the data bk (third correction data) by the correction process (primary correction) in FIG. 3, and then performs a secondary correction by using the data rk, gk, and bk.

Specifically, first, a correction value ΔRg of the data rk based on the data gk is determined using a look-up table LUT2_Rg, a correction value ΔRb of the data rk based on the data bk is determined using a look-up table LUT2_Rb, a correction value ΔGr of the data gk based on the data rk is determined using a look-up table LUT2_Gr, a correction value ΔGb of the data gk based on the data bk is determined using a look-up table LUT2_Gb, a correction value ΔBr of the data bk based on the data rk is determined using a look-up table LUT2_Br, and a correction value ΔBg of the data bk based on the data gk is determined using a look-up table LUT2_Bg.

Then, the data Rk is generated by performing gain adjustment on an addition result of the value indicated by the data rk, ΔRg and ΔRb, the data Gk is generated by performing gain adjustment on an addition result of the value indicated by the data gk, ΔGr and ΔGb, and the data Bk is generated by performing gain adjustment on an addition result of the value indicated by the data bk, ΔBr, and ΔBg. In the gain adjustment, a coefficient (for example, a coefficient of a value indicated by the data gk/a value indicated by the data Gk) is multiplied.

Then, the reverse γ process is performed on the data Rk, Gk, and Bk to generate the first output data rs, the second output data gs, and the third output data bs, respectively.

In the third embodiment, since the secondary correction using the result of the primary correction is performed, the color shift can be more accurately suppressed.

Fourth Embodiment

Figure 7:
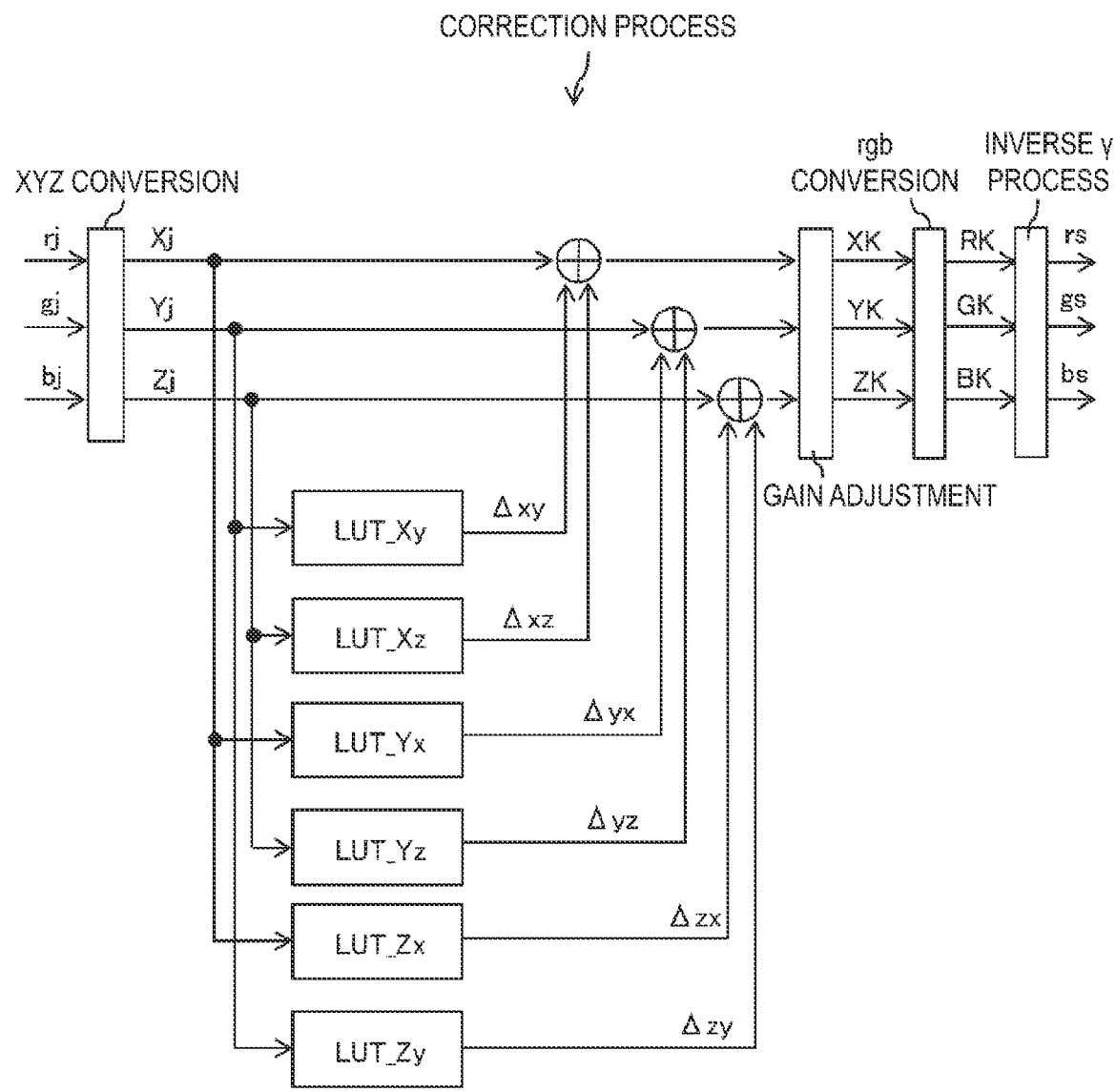
FIG. 7 is a block diagram illustrating a processing step of a data processing circuit of a fourth embodiment.

FIG. 7 is a block diagram illustrating a processing step of a data processing circuit of a fourth embodiment. In the fourth embodiment, the data processing circuit 11 performs a correction process by using tristimulus values.

Specifically, the optically linear data rj, gj, and bj are generated from the first input data ri, the second input data gi, and the third input data bi, respectively, and the data rj, gj, and bj are converted into an XYZ space of the stimulus values to obtain data Xj, Yj, and Zj (X data, Y data, and Z data), respectively.

Then, a correction value Δxy of the data Xj based on the data Yj is determined using a look-up table LUT_Xy, a correction value Δxz of the data Xj based on the data Zj is determined using a look-up table LUT_Xz, a correction value Δyx of the data Yj based on the data Xj is determined using a look-up table LUT_Yx, a correction value Δyz of the data yj based on the data zj is determined using a look-up table LUT_Yz, a correction value Δzx of the data zj based on the data xj is determined using a look-up table LUT_Zx, and a correction value Δzy of the data zj based on the data yj is determined using a look-up table LUT_Zy.

Then, the data XK is generated by performing gain adjustment on an addition result of the value indicated by the data Xj, Δxy and Δxz, the data YK is generated by performing gain adjustment on an addition result of the value indicated by the data Yj, Δyx and Δyz, and the data ZK is generated by performing gain adjustment on an addition result of the value indicated by the data Zj, Δzx, and Δzy. In the gain adjustment, a coefficient (for example, a coefficient of a value indicated by the data Zj/a value indicated by the data ZK) is multiplied.

In an rgb conversion process, the data XK, YK, and ZK in the XYZ space is converted into data RK, GK, and BK, respectively, in an rgb space. Then, the reverse γ process is performed on the data RK, GK, and BK to generate the first output data rs, the second output data gs, and the third output data bs, respectively.

In the fourth embodiment, since the X data, Y data, and Z data are used for the correction process, color shift can be more accurately suppressed.

Fifth Embodiment

Figure 8:
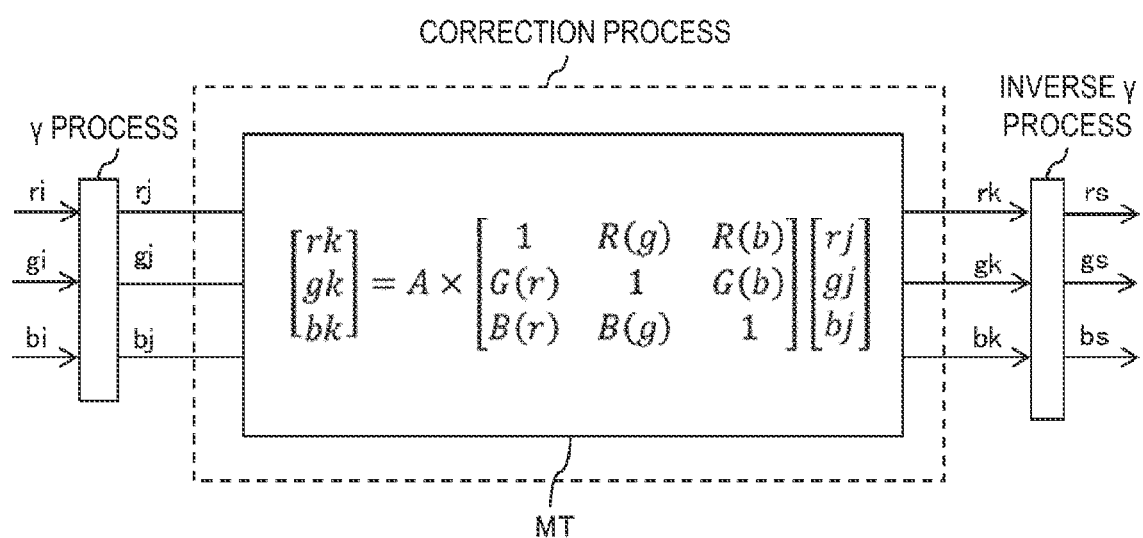
FIG. 8 is a block diagram illustrating a processing step of a data processing circuit of a fifth embodiment.

FIG. 8 is a block diagram illustrating a processing step of a data processing circuit of a fifth embodiment. In the fifth embodiment, the data processing circuit 11 performs a correction process by a matrix operation.

Specifically, rk=A×(rj+gj×R(g)+bj×R(b)), gk=A×(rj×G(r)+gj+bj×G(b)), bk=A×(rj×B(r)+gj×B(g)+bj) are calculated using the optically linear data rj, gj, and bj and a matrix MT (three rows and three columns) in FIG. 8. Where R(g) is a correction coefficient for rj based on gj, R(b) is a correction coefficient for rj based on bj, G(r) is a correction coefficient for gj based on rj, G(b) is a correction coefficient for gj based on bj, B(r) is a correction coefficient for bj based on rj, B(g) is a correction coefficient for bj based on gj, and A is the gain adjustment coefficient (for example, a value indicated by the data gj/a value indicated by the data gk). Then, the reverse γ process is performed on the data rk, gk, and bk to generate the first output data rs, the second output data gs, and the third output data bs, respectively.

In the fifth embodiment, since the matrix operation is used without using a look-up table in the correction process, the amount of memory used can be reduced.

Sixth Embodiment

Figure 9:
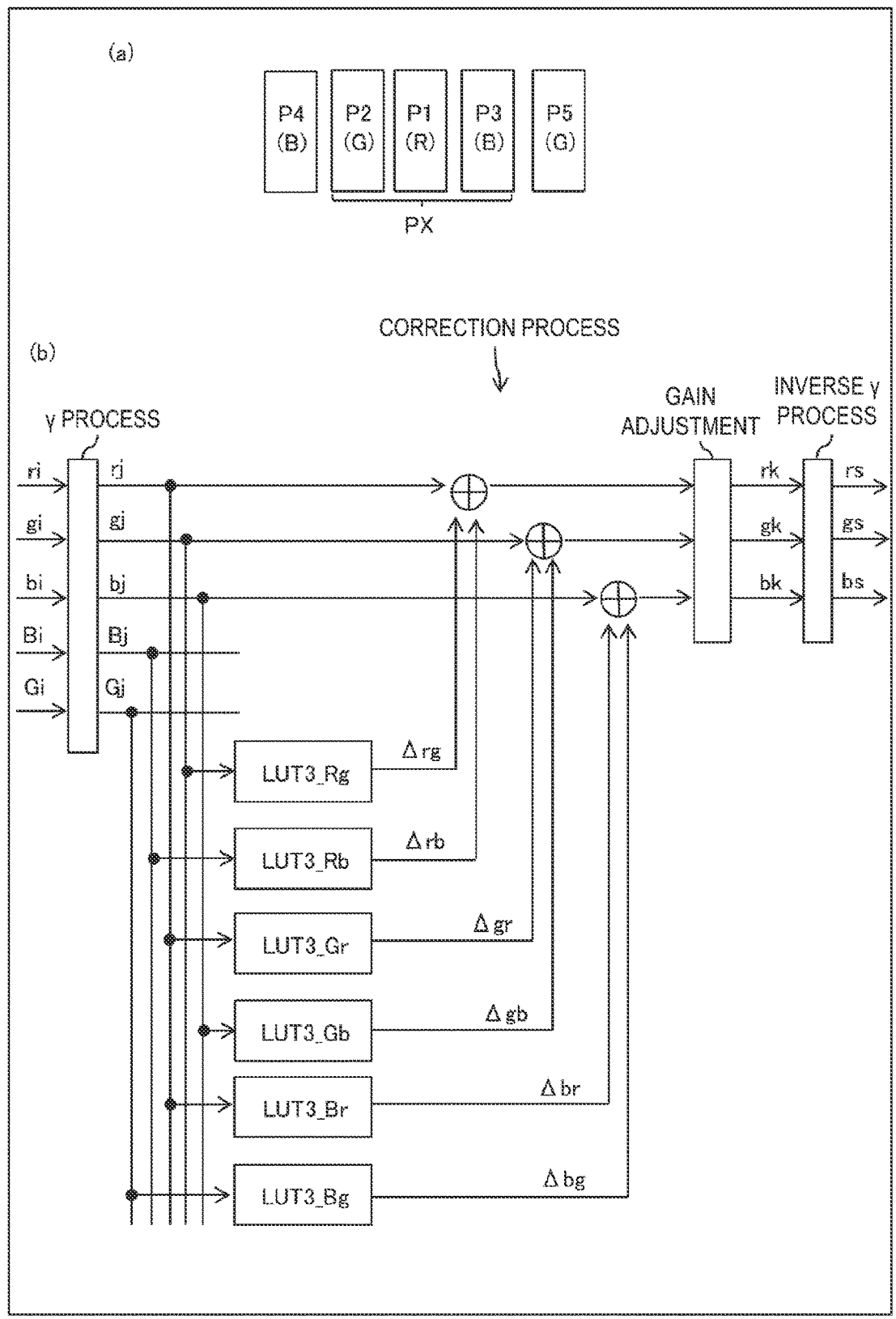
FIG. 9(a) is a schematic view illustrating an array of subpixels of a sixth embodiment.
FIG. 9(b) is a block diagram illustrating a processing step of a data processing circuit of a sixth embodiment.

FIG. 9(*a*) is a schematic view illustrating an array of subpixels of a sixth embodiment, and FIG. 9(*b*) is a block diagram illustrating a processing step of a data processing circuit of a sixth embodiment. In the sixth embodiment, the data processing circuit 11 generates the first output data rs corresponding to the first data voltage supplied to the first subpixel P1, the second output data gs corresponding to the second data voltage supplied to the second subpixel P2, and the third output data bs corresponding to the third data voltage supplied to the third subpixel P3 by using the first input data ri corresponding to the first subpixel P1 (red), the second input data gi corresponding to the second subpixel P2 (green), the third input data bi corresponding to the third subpixel P3 (blue), a fourth input data Bi corresponding to a fourth subpixel P4 (including a quantum dot light-emitting layer for emitting blue light), and a fifth input data Gi corresponding to a fifth subpixel P5 (including a quantum dot light-emitting layer for emitting green light).

As illustrated in FIG. 9(*a*), the first subpixel P1 is adjacent to the second subpixel P2 and the third subpixel P3, the second subpixel P2 is adjacent to the first subpixel P1 and the fourth subpixel P4, and the third subpixel P3 is adjacent to the first subpixel P1 and the fifth subpixel P5.

In the γ process, the optically linear data rj, gj, bj, Bj, and Gj are generated from the first input data ri, the second input data gi, the third input data bi, the fourth input data Bi, and the fifth input data Gi, respectively.

In the correction process, corrected data rk, gk, and bk are generated from the data rj, gj, bj, Bj, and Gj. Specifically, first, a correction value Δrg of the data rj based on the data gj is determined using a look-up table LUT3_Rg, a correction value Δrb of the data rj based on the data Bj is determined using a look-up table LUT3_Rb, a correction value Δgr of the data gj based on the data rj is determined using a look-up table LUT3_Gr, a correction value Δgb of the data gj based on the data bj is determined using a look-up table LUT3_Gb, a correction value Δbr of the data bj based on the data rj is determined using a look-up table LUT3_Br, and a correction value Δbg of the data bj based on the data Gj is determined using a look-up table LUT3_Bg.

Then, the data rk is generated by performing gain adjustment on an addition result of the value indicated by the data rj, Δrg and Δrb, the data gk is generated by performing gain adjustment on an addition result of the value indicated by the data gj, Δgr and Δgb, and the data bk is generated by performing gain adjustment on an addition result of the value indicated by the data bj, Δbr, and Δbg. In the gain adjustment, a coefficient (for example, a coefficient of a value indicated by the data gj/a value indicated by the data gk) is multiplied.

In the reverse γ process, the first output data rs, the second output data gs, and the third output data bs are generated from the data rk, gk, and bk, respectively.

In the sixth embodiment, since the output data of a subpixel is generated using the input data of the subpixel and the two subpixels adjacent to the subpixel, color shift can be accurately suppressed.

The embodiments described above are for the purpose of illustration and description and are not intended to be limiting. It will be apparent to those skilled in the art that many variations will be possible in accordance with these examples and descriptions.

The invention claimed is:

1. A display device comprising:
   a first subpixel including a quantum dot light-emitting layer configured to emit light of a first color;
   a second subpixel including a quantum dot light-emitting layer configured to emit light of a second color different from the light of the first color;
   a third subpixel including a quantum dot light-emitting layer configured to emit light of a third color different from the light of the first color and the light of the second color; and
   a data processing circuit configured to receive first input data corresponding to the first subpixel, second input data corresponding to the second subpixel, and third input data corresponding to the third subpixel,
   wherein the data processing circuit is further configured to generate:
     first output data corresponding to a first data voltage supplied to the first subpixel by using the first input data, the second input data, and the third input data,
     second output data corresponding to a second data voltage supplied to the second subpixel by using the first input data, the second input data, and the third input data, and
     third output data corresponding to a third data voltage supplied to the third subpixel by using the first input data, the second input data, and the third input data, and
   wherein a wavelength range of the light of the first color is closer to a long wavelength side than a wavelength range of the light of the second color, and a wavelength range of the light of the second color is closer to the long wavelength side than a wavelength range of the light of the third color,
   a gray scale of the second output data is TGc and a gray scale of the third output data is TBc in a case that a gray scale of the first input data is Tc, where Tc is lower than a center of a full gray scale, a gray scale of the second input data is Tm, and a gray scale of the third input data is Tn,
   the gray scale of the second output data is TGd and the gray scale of the third output data is TBd in a case that the gray scale of the first input data is Td, where Td is higher than the center of the full gray scale, the gray scale of the second input data is Tm, and the gray scale of the third input data is Tn,
   TGc<TGd, and
   TBc<TBd.

2. The display device according to claim 1,
   wherein the data processing circuit is further configured to generate first conversion data, second conversion data, and third conversion data, the first, second, and third conversion data being optically linear data from the first input data, the second input data, and the third input data, respectively, and the data processing circuit includes a first look-up table in which the second conversion data is associated with a correction value of the first conversion data, and a second look-up table in which the third conversion data is associated with another correction value of the first conversion data.

3. The display device according to claim 2,
wherein the data processing circuit further includes a third look-up table in which the first conversion data is associated with a correction value of the second conversion data, and a fourth look-up table in which the third conversion data is associated with another correction value of the second conversion data.

4. The display device according to claim 3,
wherein the data processing circuit further includes a fifth look-up table in which the first conversion data is associated with a correction value of the third conversion data, and a sixth look-up table in which the second conversion data is associated with another correction value of the third conversion data.

5. The display device according to claim 4,
wherein first correction data is obtained by performing brightness adjustment processing on an addition result of the first conversion data, the correction value of the first conversion data based on the second conversion data, and the other correction value of the first conversion data based on the third conversion data,
second correction data is obtained by performing brightness adjustment processing on an addition result of the second conversion data, the correction value of the second conversion data based on the first conversion data, and the other correction value of the second conversion data based on the third conversion data, and
third correction data is obtained by performing brightness adjustment processing on an addition result of the third conversion data, the correction value of the third conversion data based on the first conversion data, and the other correction value of the third conversion data based on the second conversion data.

6. The display device according to claim 5,
wherein the data processing circuit is further configured to perform a primary correction using the first input data, the second input data, and the third input data, and a secondary correction using the first correction data, the second correction data, and the third correction data.

7. The display device according to claim 1,
wherein the data processing circuit is further configured to generate first conversion data, second conversion data, and third conversion data, the first, second, and third conversion data being optically linear data from the first input data, the second input data, and the third input data, respectively, and
the first output data is generated by using X data, Y data, and Z data obtained by converting the first conversion data, the second conversion data, and the third conversion data, respectively, into an XYZ space of stimulus values.

8. A display device comprising:
a first subpixel including a quantum dot light-emitting layer configured to emit light of a first color;
a second subpixel including a quantum dot light-emitting layer configured to emit light of a second color different from the light of the first color;
a third subpixel including a quantum dot light-emitting layer configured to emit light of a third color different from the light of the first color and the light of the second color; and
a data processing circuit configured to receive first input data corresponding to the first subpixel, second input data corresponding to the second subpixel, and third input data corresponding to the third subpixel,
wherein the data processing circuit is further configured to generate:
first output data corresponding to a first data voltage supplied to the first subpixel by using the first input data, the second input data, and the third input data,
second output data corresponding to a second data voltage supplied to the second subpixel by using the first input data, the second input data, and the third input data, and
third output data corresponding to a third data voltage supplied to the third subpixel by using the first input data, the second input data, and the third input data, and
wherein a wavelength range of the light of the first color is closer to a long wavelength side than a wavelength range of the light of the second color, and a wavelength range of the light of the second color is closer to a long wavelength side than a wavelength range of the light of the third color,
a gray scale of the first output data is TRe and a gray scale of the third output data is TBe in a case that a gray scale of the first input data is Tm, a gray scale of the second input data is Te, where Te is lower than a center of a full gray scale, and the gray scale of the third input data is Tn,
the gray scale of the first output data is TRf and the gray scale of the third output data is TBf in a case that the gray scale of the first input data is Tm, the gray scale of the second input data is Tf, where Tf is higher than the center of the full gray scale, and the gray scale of the third input data is Tn,
TRe>TRf, and
TBe<TBf.

9. The display device according to claim 8,
wherein the data processing circuit is further configured to generate first conversion data, second conversion data, and third conversion data, the first, second, and third conversion data being optically linear data from the first input data, the second input data, and the third input data, respectively, and
the data processing circuit includes a first look-up table in which the second conversion data is associated with a correction value of the first conversion data, and a second look-up table in which the third conversion data is associated with another correction value of the first conversion data.

10. The display device according to claim 9,
wherein the data processing circuit further includes a third look-up table in which the first conversion data is associated with a correction value of the second conversion data, and a fourth look-up table in which the third conversion data is associated with another correction value of the second conversion data.

11. The display device according to claim 10,
wherein the data processing circuit further includes a fifth look-up table in which the first conversion data is associated with a correction value of the third conversion data, and a sixth look-up table in which the second conversion data is associated with another correction value of the third conversion data.

12. The display device according to claim 11,
wherein first correction data is obtained by performing brightness adjustment processing on an addition result of the first conversion data, the correction value of the first conversion data based on the second conversion data, and the other correction value of the first conversion data based on the third conversion data,
second correction data is obtained by performing brightness adjustment processing on an addition result of the second conversion data, the correction value of the second conversion data based on the first conversion data, and the other correction value of the second conversion data based on the third conversion data, and
third correction data is obtained by performing brightness adjustment processing on an addition result of the third conversion data, the correction value of the third conversion data based on the first conversion data, and the other correction value of the third conversion data based on the second conversion data.

13. The display device according to claim 12,
wherein the data processing circuit is further configured to perform a primary correction using the first input data, the second input data, and the third input data, and a secondary correction using the first correction data, the second correction data, and the third correction data.

14. The display device according to claim 8,
wherein the data processing circuit is further configured to generate first conversion data, second conversion data, and third conversion data, the first, second, and third conversion data being optically linear data from the first input data, the second input data, and the third input data, respectively, and
the first output data is generated by using X data, Y data, and Z data obtained by converting the first conversion data, the second conversion data, and the third conversion data, respectively, into an XYZ space of stimulus values.

15. A display device comprising:
a first subpixel including a quantum dot light-emitting layer configured to emit light of a first color;
a second subpixel including a quantum dot light-emitting layer configured to emit light of a second color different from the light of the first color;
a third subpixel including a quantum dot light-emitting layer configured to emit light of a third color different from the light of the first color and the light of the second color; and
a data processing circuit configured to receive first input data corresponding to the first subpixel, second input data corresponding to the second subpixel, and third input data corresponding to the third subpixel,
wherein the data processing circuit is further configured to generate:
  first output data corresponding to a first data voltage supplied to the first subpixel by using the first input data, the second input data, and the third input data,
  second output data corresponding to a second data voltage supplied to the second subpixel by using the first input data, the second input data, and the third input data, and
  third output data corresponding to a third data voltage supplied to the third subpixel by using the first input data, the second input data, and the third input data, and wherein a wavelength range of the light of the first color is closer to a long wavelength side than a wavelength range of the light of the second color, and a wavelength range of the light of the second color is closer to a long wavelength side than a wavelength range of the light of the third color,
a gray scale of the first output data is TRp and a gray scale of the second output data is TGp in a case that a gray scale of the first input data is Tm, a gray scale of the second input data is Tn, and a gray scale of the third input data is Tp, where Tp is lower than a center of a full gray scale,
the gray scale of the first output data is TRq and the gray scale of the second output data is TGq in a case that the gray scale of the first input data is Tm, the gray scale of the second input data is Tn, and the gray scale of the third input data is Tq, where Tq is higher than the center of the full gray scale,
TRp>TRq, and
TGp>TGq.

16. The display device according to claim 15,
wherein the data processing circuit is further configured to generate first conversion data, second conversion data, and third conversion data, the first, second, and third conversion data being optically linear data from the first input data, the second input data, and the third input data, respectively, and
the data processing circuit includes a first look-up table in which the second conversion data is associated with a correction value of the first conversion data, and a second look-up table in which the third conversion data is associated with another correction value of the first conversion data.

17. The display device according to claim 16,
wherein the data processing circuit further includes a third look-up table in which the first conversion data is associated with a correction value of the second conversion data, and a fourth look-up table in which the third conversion data is associated with another correction value of the second conversion data.

18. The display device according to claim 17,
wherein the data processing circuit further includes a fifth look-up table in which the first conversion data is associated with a correction value of the third conversion data, and a sixth look-up table in which the second conversion data is associated with another correction value of the third conversion data.

19. The display device according to claim 18,
wherein first correction data is obtained by performing brightness adjustment processing on an addition result of the first conversion data, the correction value of the first conversion data based on the second conversion data, and the other correction value of the first conversion data based on the third conversion data,
second correction data is obtained by performing brightness adjustment processing on an addition result of the second conversion data, the correction value of the second conversion data based on the first conversion data, and the other correction value of the second conversion data based on the third conversion data, and
third correction data is obtained by performing brightness adjustment processing on an addition result of the third conversion data, the correction value of the third conversion data based on the first conversion data, and the other correction value of the third conversion data based on the second conversion data.

20. The display device according to claim 15,
wherein the data processing circuit is further configured to generate first conversion data, second conversion data, and third conversion data, the first, second, and third conversion data being optically linear data from the first input data, the second input data, and the third input data, respectively, and the first output data is generated by using X data, Y data, and Z data obtained by converting the first conversion data, the second conversion data, and the third conversion data, respectively, into an XYZ space of stimulus values.

* * * * *